United States Patent
Chao et al.

(10) Patent No.: US 11,342,181 B2
(45) Date of Patent: May 24, 2022

(54) SEMICONDUCTOR DEVICES AND METHODS OF MANUFACTURE

(71) Applicant: Taiwan Semiconductor Manufacturing Co., Ltd., Hsinchu (TW)

(72) Inventors: Tzu-Ang Chao, Hsinchu (TW); Gregory Michael Pitner, Sunnyvale, CA (US); Tse-An Chen, Taoyuan (TW); Lain-Jong Li, Hsinchu (TW); Yu Chao Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 29 days.

(21) Appl. No.: 17/071,554

(22) Filed: Oct. 15, 2020

(65) Prior Publication Data
US 2021/0358750 A1 Nov. 18, 2021

Related U.S. Application Data

(60) Provisional application No. 63/025,341, filed on May 15, 2020.

(51) Int. Cl.
*H01L 21/02* (2006.01)
*H01L 29/06* (2006.01)
*H01L 51/00* (2006.01)
(Continued)

(52) U.S. Cl.
CPC ........... *H01L 21/02606* (2013.01); *H01L 29/0669* (2013.01); *H01L 29/401* (2013.01);
(Continued)

(58) Field of Classification Search
CPC .......... H01L 21/02606; H01L 29/0669; H01L 51/0048; H01L 51/0558; H01L 51/56;
(Continued)

(56) References Cited

U.S. PATENT DOCUMENTS 7,147,894 B2  12/2006  Zhou et al.
8,197,888 B2  6/2012  Sue et al.
(Continued)

FOREIGN PATENT DOCUMENTS

TW  200307574 A  12/2003
TW  200503948 A  2/2005
(Continued)

OTHER PUBLICATIONS

Cao, Qing et al., "Arrays of single-walled carbon nanotubes with full surface coverage for high-performance electronics," Nature Nanotechnology, vol. 8, Mar. 2013, pp. 180-186.
(Continued)

*Primary Examiner* — Ermias T Woldegeorgis
(74) *Attorney, Agent, or Firm* — Slater Matsil, LLP

(57) ABSTRACT

A semiconductor device and method of manufacturing using carbon nanotubes are provided. In embodiments a stack of nanotubes are formed and then a non-destructive removal process is utilized to reduce the thickness of the stack of nanotubes. A device such as a transistor may then be formed from the reduced stack of nanotubes.

20 Claims, 9 Drawing Sheets

(51) Int. Cl.
   *H01L 29/78* (2006.01)
   *H01L 29/423* (2006.01)
   *H01L 29/40* (2006.01)
   *H01L 29/66* (2006.01)
   *H01L 51/05* (2006.01)
   *H01L 51/56* (2006.01)
   *H01L 51/10* (2006.01)
   *H01L 29/786* (2006.01)

(52) U.S. Cl.
   CPC .. *H01L 29/42356* (2013.01); *H01L 29/42392* (2013.01); *H01L 29/66045* (2013.01); *H01L 29/78* (2013.01); *H01L 29/786* (2013.01); *H01L 29/7845* (2013.01); *H01L 51/0003* (2013.01); *H01L 51/0048* (2013.01); *H01L 51/055* (2013.01); *H01L 51/057* (2013.01); *H01L 51/0525* (2013.01); *H01L 51/0558* (2013.01); *H01L 51/105* (2013.01); *H01L 51/56* (2013.01)

(58) Field of Classification Search
   CPC ................. H01L 29/786; H01L 51/057; H01L 51/0003; H01L 51/0525; H01L 51/055; H01L 51/105; H01L 29/401; H01L 29/42356; H01L 29/66045; H01L 29/78; H01L 29/42392; H01L 29/7845
   See application file for complete search history.

(56) References Cited

U.S. PATENT DOCUMENTS 9,136,117 B2  9/2015  Li et al.
2018/0366666 A1* 12/2018  Lu ........................ H01L 51/0048

FOREIGN PATENT DOCUMENTS

| TW | 200738553 A | 10/2007 |
| TW | 200906718 A | 2/2009 |
| TW | 201339087 A | 10/2013 |

OTHER PUBLICATIONS

He, Xiaowei et al., "Wafer-scale monodomain films of spontaneously aligned single-walled carbon nanotubes," Nature Nanotechnology, vol. 11, Jul. 2016, pp. 633-639.

Joo, Yongho et al., "Dose-Controlled, Floating Evaporative Self-assembly and Alignment of Semiconducting Carbon Nanotubes from Organic Solvents," ACS Publications, Langmuir, Mar. 2, 2014, pp. 3460-3466.

Patil, Nishant et al., "Wafer-Scale Growth and Transfer of Aligned Single-Walled Carbon Nanotubes," IEEE Transactions on Nanotechnology, vol. 8, No. 4, Jul. 2009, pp. 498-504.

* cited by examiner

SEMICONDUCTOR DEVICES AND METHODS OF MANUFACTURE

PRIORITY CLAIM AND CROSS-REFERENCE

This application claims the benefit of U.S. Provisional Application No. 63/025,341, filed on May 15, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. As feature size continues to shrink in semiconductor manufacturing process, more challenges arise that need to be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
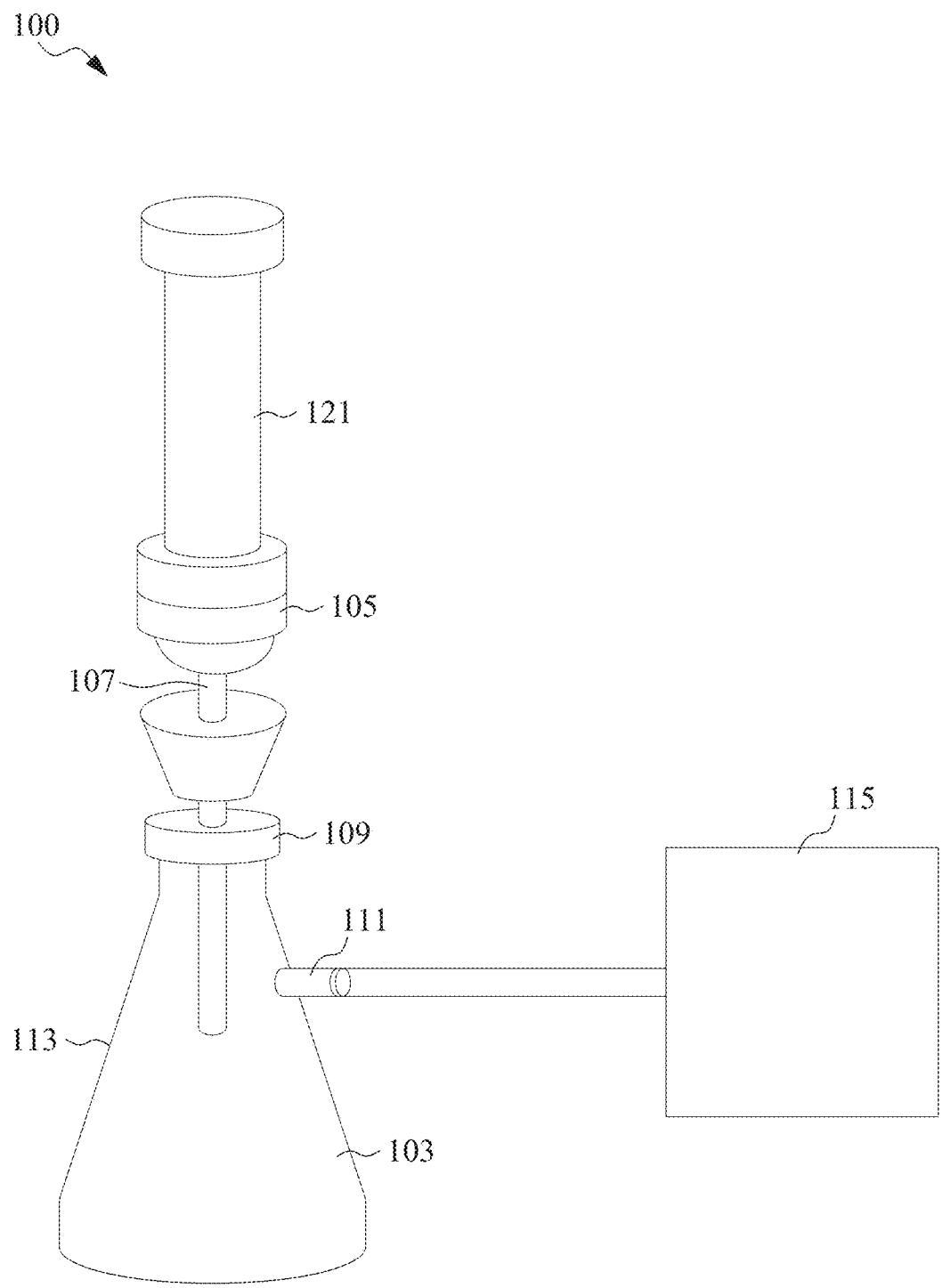
FIGS. 1A-1B illustrate a filtering of a carbon nanotube solution, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular embodiments which utilize a vacuum system and filter in order to deposit and align a stack of carbon nanotubes. Once the stack of carbon nanotubes is formed, a controlled reduction process can be utilized to make one or more layers of carbon nanotubes, which are then used to form semiconductor devices. However, the embodiments presented herein are intended to be illustrative and are not intended to be limiting, as the ideas can be utilized in a wide variety of embodiments, such as various front end of line (FEOL) processes and back end of line (BEOL) processes.

With respect now to FIGS. 1A-1B, there is illustrated a system 100 to deposit and align carbon nanotubes 101 (not seen in FIG. 1A but illustrated and described below with respect to FIG. 1B). In an embodiment the system 100 comprises a vacuum chamber 103 connected to a filter 105 through a connecting tube 107. In an embodiment the vacuum chamber 103 may be a chamber with both a first inlet 109 as well as a first outlet 111. In an embodiment the vacuum chamber 103 may be sized and shaped in order to enhance the ability of the vacuum chamber 103 to help carbon nanotubes 101 deposit and align within the system 100. In some embodiments the vacuum chamber 103 may be shaped as an Erlenmeyer flask, although any suitable shape, such as a cylindrical shape, a hollow square tube, an octagonal shape, or the like, may also be utilized. Furthermore, the vacuum chamber 103 may be surrounded by a housing 113 made of material that is inert to the various process materials. As such, while the housing 113 may be any suitable material that can withstand the chemistries and pressures involved in the filtering process, in an embodiment the housing 113 may be glass, steel, stainless steel, nickel, aluminum, alloys of these, combinations of these, and like. However, any suitable materials may be utilized for the housing 113 of the vacuum chamber 103.

A vacuum pump 115 may be connected to the first outlet 111. In an embodiment the vacuum pump 115 is utilized to help create the desired vacuum within the vacuum chamber 103, which pressure differential can then be utilized to help filter the carbon nanotubes 101 from a solution and deposit the carbon nanotubes 101 onto the filter 105 by reducing and controlling the pressure within the vacuum chamber 103. However, any suitable method of reducing the pressure in the vacuum chamber 103 may be utilized.

The connecting tube 107 extends through a gasket and into the first inlet 109 of the vacuum chamber 103 and connects the vacuum chamber 103 to the filter 105. In an embodiment the connecting tube 107 works to connect the vacuum chamber 103 to the filter 105, which allows the pressure differential to be applied between the vacuum chamber 103 and one side of the filter 105. In an embodiment the connecting tube 107 may be any suitable material that can withstand the pressures and chemistries involved, and in some embodiments may be a material such as glass, steel, stainless steel, nickel, aluminum, alloys of these, combinations of these, and like. However, any suitable material may be utilized.

Figure 1B:
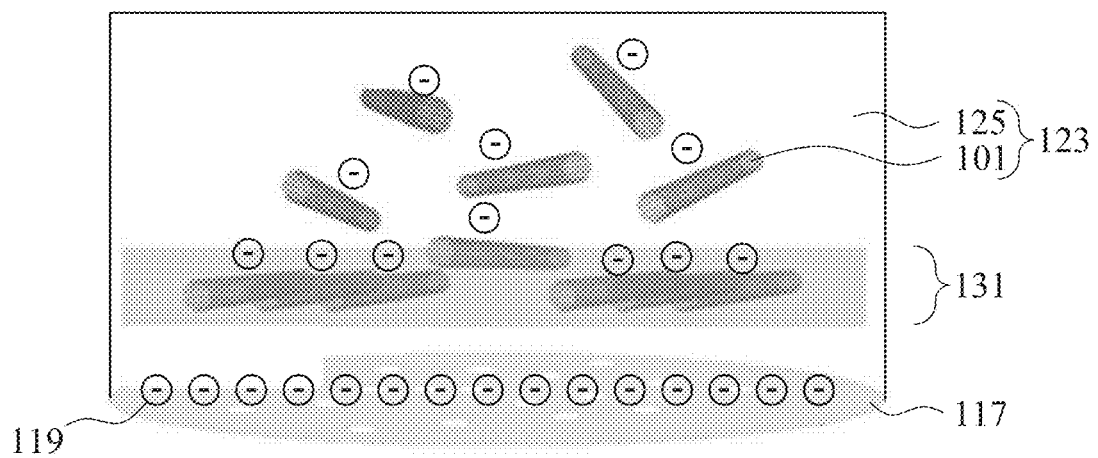

With reference now to the filter 105, FIG. 1A illustrates an exterior view of the filter 105 and the location of the filter 105 within the system 100, while FIG. 1B illustrates an interior view of the filter 105. As illustrated in FIG. 1B, in some embodiments the filter 105 comprises a filter membrane 117 (not seen in FIG. 1A but seen in FIG. 1B) that is utilized to filter the carbon nanotubes 101 from a carbon nanotube solution 123 as the carbon nanotube solution 123 is pulled through the filter membrane 117 by the pressure differential from the vacuum chamber 103. In an embodiment the filter membrane 117 may be a material such as polycarbonate, polytetrafluoroethene, or polyvinylidene fluoride, with a pore diameter that is smaller than the carbon nanotubes 101 (in order to filter the carbon nanotubes 101), such as being between about 0.01 μm and about 10 μm. However, any suitable material and any suitable pore diameter may be utilized.

Additionally, while the pore size described above is sufficient to simply remove the carbon nanotubes 101 from the carbon nanotube solution 123, the use of a simple filter by itself may not be sufficient to align the carbon nanotubes 101 during the filtering process. As such, in some embodiments the filter membrane 117 is utilized to also generate an electrostatic field (represented in FIG. 1B by the circled negative signs labeled 119) that can be utilized to align the carbon nanotubes 101 as the carbon nanotubes 101 enter into the electrostatic field 119 during the filtering process. In some embodiments the electrostatic field 119 may be passively generated while in other embodiments the electrostatic field 119 may be actively generated during the filtering process.

Looking first at embodiments in which the electrostatic field 119 is generated passively, the filter membrane 117 may be used to create the electrostatic field 119 by coating the filter membrane 117 with a coating material (not separately illustrated in FIG. 1B for clarity) that will passively create the desired electrostatic field 119. In an embodiment the coating material may comprise a hydrophilic material such as poly(vinylpyrrolidone) (PVP), hexamethyldisilazane (HMDS), aluminum oxide ($Al_2O_3$), combinations of these, or the like. However, any suitable material may be utilized.

In embodiments in which poly(vinylpyrrolidone) is utilized as the coating material, the poly(vinylpyrrolidone) will passively generate the desired electrostatic field 119. In such embodiments, the electrostatic field 119 may have a voltage of between about 0 V and about 10 V at a distance of between about 0 nm and about 10 nm. However, any suitable electrostatic field 119 may be generated using passive generation, and all such methods of generating the electrostatic field may be utilized.

In another embodiment the electrostatic field 119 can be actively generated either prior to or during the filtering process by capturing negative charges. In such an embodiment, instead of permanently coating the filter membrane 117 with a single material, the filter membrane 117 is actively charged prior to the filtering process with a surfactant. For example, in some embodiments the surfactant may be a negatively charged material such as sodium dodecyl sulfate (SDS), sodium dodecylbenzenesulfonate (SDBS), sodium deoxycholate (DOC), combinations of these, or the like. However, any suitable surfactants may be utilized.

In an embodiment the surfactant may be introduced to the filter membrane 117 prior to introduction of the carbon nanotube solution 123. In an embodiment the surfactant may be introduced to the filter membrane 117 by flowing the surfactant over and/or through the filter membrane 117 so that at least a portion of the negative charge from the surfactant is captured on the filter membrane 117 and remains at least partially in place during a subsequent filtering process.

In another embodiment the surfactant may be included as part of the carbon nanotube solution 123. In such an embodiment the surfactant may be included in the carbon nanotube solution 123 instead of flowing the surfactant over the filter membrane 117 prior to introduction of the carbon nanotube solution 123. In other embodiments the surfactant may be flowed over the filter membrane 117 before the filtering process and is also introduced again within the carbon nanotube solution 123. Any suitable combination of processes to introduce the surfactant to the filter membrane 117 may be utilized, and all such processes are fully intended to be included within the scope of the embodiments.

In embodiments in which the electrostatic field 119 is generated using a surfactant in an active generation process, the surfactant will actively generate the desired electrostatic field 119 in each filtering process. In such embodiments, the electrostatic field 119 may have a voltage of between about 0 V and about 10 V at a distance of between about 0 nm and about 10 nm. However, any suitable electrostatic field 119 may be generated using active generation, and all such methods of generating the electrostatic field may be utilized.

Returning now to FIG. 1A, FIG. 1A additionally illustrates a solution container 121 connected to one side of the filter 105 that is opposite the vacuum chamber 103. In an embodiment the solution container 121 may be used to store and/or supply a carbon nanotube solution 123 (see FIG. 1B) to the filter 105. In one embodiment the solution container 121 may be a container of a material that can withstand the pressure and chemistries involved in the filtration process, and in some embodiments may be a material such as glass, steel, stainless steel, nickel, aluminum, alloys of these, combinations of these, and the like. However, any suitable material may be utilized.

In another embodiment the solution container 121 may be an entrance for the carbon nanotube solution 123 to enter the filter 105 while the carbon nanotube solution 123 may be stored and/or even created separately from the filter 105. For example, in some embodiments the carbon nanotube solution 123 may be mixed and/or stored prior to the introduction of the carbon nanotube solution 123 to the filter 105, and the solution container 121, instead of being a stand-alone system that is attached and removed from the system 100, is a supply system which provides a steady supply of the carbon nanotube solution 123 during the filtering process.

The carbon nanotube solution 123 comprises the carbon nanotubes 101 dispersed within a solvent 125. In an embodiment the carbon nanotubes 101 may be single-walled carbon nanotubes formed using any suitable method, such as a carbon arc discharge method (with subsequent purification), a laser vaporization method, a catalyzed chemical vapor deposition, ball milling and subsequent annealing, diffusion flame syntheses, electrolysis, heat treatment of a polymer, low-temperature solid pyrolysis, combinations of these, or the like. However, any suitable method of manufacturing the carbon nanotubes 101 may be utilized, and all such methods are fully intended to be included within the scope of the embodiments.

Optionally, in some embodiments the carbon nanotubes 101 may be surrounded by spacers 129 which can provide a dual purpose of acting as a purification agent for the carbon nanotubes 101 as well as working to help disperse the carbon nanotubes 101 within the carbon nanotube solution 123. Additionally, by controlling the thickness of the spacers 129 around each of the carbon nanotubes 101, the spacing of the carbon nanotubes 101 once the carbon nanotubes 101 have been aligned adjacent to each other can also be controlled.

In an embodiment the spacers 129 can be a material which can be placed and removed from the carbon nanotubes as desired, while also not detrimentally interfering with the manufacturing processes between placement and removal. For example, in particular embodiments the spacers 129 may be a material such as a surfactant (e.g., sodium dodecyl sulfate, sodium dodecylbenzenesulfonate, sodium deoxycholate, etc.), a polymer (e.g., poly[(9,9-dioctylfluorenyl-2,7-diyl)-alt-co-(6,6'-{2,2'-bipyridine}), isoindigo-based poly (9, 9-dioctylfluorene), poly[9-(1-octylonoyl)-9H-carbazole-2,7-diyl, etc.), a dielectric material (e.g., $HfO_2/SiO_2/Al_2O$, etc.) or even other nanotubes (e.g., a boron nitride nanotube, a $MoS_2$ nanotube, etc.). However, any suitable material or combination of materials may be utilized to surround and coat the carbon nanotubes 101 during the filtering process.

The spacers 129 may be placed around the carbon nanotubes 101 using any suitable process. For example, processes such as chemical vapor deposition, atomic layer deposition, surfactant wrapping, polymer wrapping, combinations of these, or the like, may be utilized to place the spacers 129 around the individual carbon nanotubes 101. Additionally, in embodiments in which the spacers 129 are utilized to control the spacing between adjacent carbon nanotubes 101 once the carbon nanotubes 101 have settled adjacent to each other, the spacers 129 may have a thickness from between about 0 Å to about 10 nm. However, any suitable method of placement and any suitable thickness may be utilized.

In an embodiment the carbon nanotube solution 123 is formed by placing the carbon nanotubes 101 (with or without the spacers 129) into a solvent 125. In an embodiment the solvent 125 may be utilized to contain the carbon nanotubes 101 during transport and also to provide a suitable medium for the carbon nanotubes 101 to settle in the desired order orientation (described further below) during the filtering process. In some embodiments the solvent 125 may be a solvent such as water ($H_2O$), toluene, trichloroethane, tetrahydrofuran, or chloroform. However, any suitable material for the solvent 125 may be utilized.

In an embodiment the carbon nanotubes 101 may have a concentration within the solvent 125 that is high enough to allow for an efficient settling of the carbon nanotubes 101 while also not so high that the sheer number of carbon nanotubes 101 interferes with the settling process. As such, the carbon nanotubes 101 may have a concentration within the carbon nanotube solution 123 of between about 0.001 mg/ml and about 1 mg/ml. However, any suitable concentration may be utilized.

Additionally, while the carbon nanotube solution 123 is described as comprising the solvent 125 and the carbon nanotubes 101, this description is intended to be illustrative and is not intended to be limiting. In particular, the carbon nanotube solution 123 may comprise any other suitable or desirable additives, such as the surfactant that is utilized for an active generation of the desired electrostatic field 119. All such additives are fully intended to be included within the scope of the embodiments.

To initiate the filtering process, the carbon nanotube solution 123 is placed within the solution container 121 and the solution container 121 is connected to the filter 105 so that the carbon nanotube solution 123 is able to flow to the filter membrane 117. Additionally, a vacuum is created in the vacuum chamber 103 using the vacuum pump 115 as a driving force to pull the carbon nanotube solution 123 through the filter membrane 117. In an embodiment, the vacuum pump 115 connected to the first outlet 111 can be utilized to reduce the pressure in the vacuum chamber 103 to between about 1 mtorr and about 760 torr. However, any suitable pressure may be utilized.

With the vacuum in place within the vacuum chamber 103, a pressure differential is created between a first side of the filter membrane 117 facing the vacuum chamber 103 and a second side of the filter membrane 117 facing the carbon nanotube solution 123. With the pressure differential applied, the carbon nanotube solution 123 is pulled through the filter membrane 117, filtering the carbon nanotubes 101 from the solvent 125 as the solvent 125 passes through the filter membrane 117 while the filter membrane 117 captures the carbon nanotubes 101 that are too large to pass through the filter membrane 117.

Additionally, with the presence of the electrostatic field 119 on the filter membrane 117 (generated either passively or actively), a combination of the electrostatic field 119 and Van der Waals attraction will also work to align the carbon nanotubes 101 as the carbon nanotubes 101 settle onto the filter membrane 117, so that the carbon nanotubes 101 settle parallel and aligned to each other. In particular, in an embodiment in which the carbon nanotubes 101 have a negative charge (e.g., from the negatively charged surfactants wrapped around the carbon nanotubes 101 as the spacers 129) and the electrostatic field 119 also has a negative charge, the electrostatic field 119 will work to force the carbon nanotubes 101 to align parallel with each other as the carbon nanotubes 101 are filtered by the filter membrane 117.

As the filtering process continues, the carbon nanotubes 101 within the carbon nanotube solution 123 are deposited as a first layer 131 of the carbon nanotubes 101, wherein within the first layer 131 the carbon nanotubes 101 are aligned next to each other. Additionally, once the first layer 131 of the carbon nanotubes 101 are deposited, a second layer 201 of the carbon nanotubes 101, a third layer 203 of the carbon nanotubes 101, a fourth layer 205 of the carbon nanotubes 101, a fifth layer 207 of the carbon nanotubes 101, and a sixth layer 209 of the carbon nanotubes 101 are deposited in order to form a stack 211 (not illustrated in FIG. 1B but illustrated and described further below with respect to FIG. 2A) of carbon nanotubes 101. Any suitable number of layers of the carbon nanotubes 101 may be deposited during the filtering process.

Figure 2A:
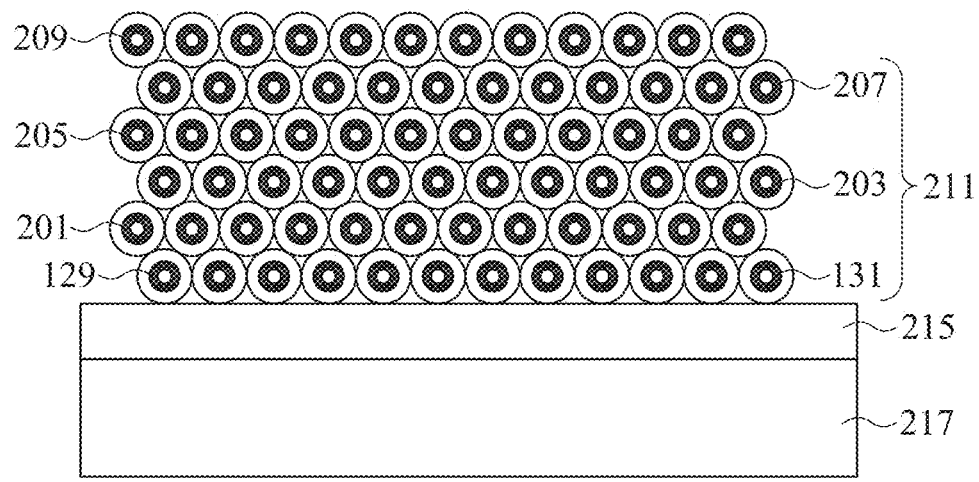
FIGS. 2A-2B illustrate a placement of a stack of nanotubes onto a substrate, in accordance with some embodiments.
Figure 2B:
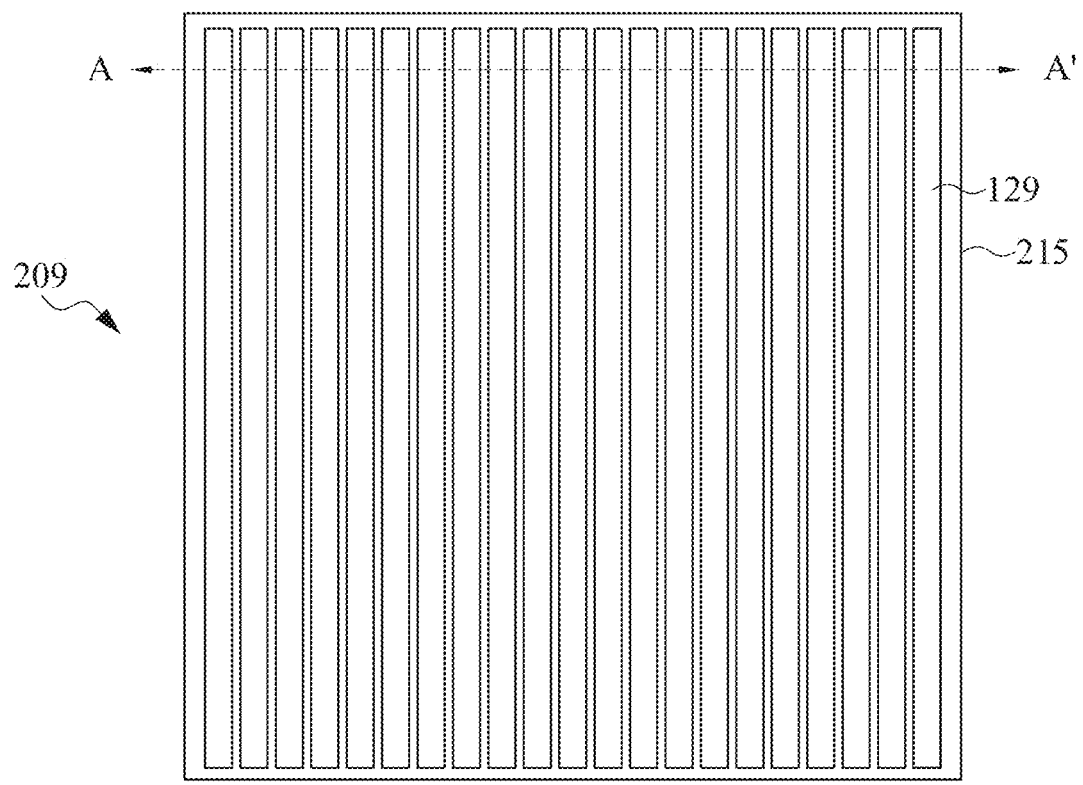

FIGS. 2A-2B illustrate that, once the stack 211 of carbon nanotubes 101 has been deposited on the filter membrane 117, the stack 211 of carbon nanotubes 101 may be transferred to a first dielectric layer 215 located over a first substrate 217, with FIG. 2A illustrating a cross sectional view of the top down view of FIG. 2B through line A-A'. In an embodiment the first substrate 217 may be a support material such as a silicon material (e.g., a silicon wafer), a germanium material, a silicon germanium material, a gallium arsenide material, although other substrates, such as semiconductor-on-insulator (SOI), strained SOI, silicon germanium on insulator, glass substrate, combinations of these, or the like. However, any suitable material may be used for the first substrate 217.

The first dielectric layer 215 is located over the first substrate 217 and is utilized to isolate devices subsequently formed on the first substrate 217. In an embodiment the first dielectric layer 215 is a dielectric material such as silicon oxide, aluminum oxide, combinations of these, or the like deposited onto the first substrate 217 using a deposition process such as chemical vapor deposition, sputtering, atomic layer deposition, combinations of these, or the like. However, any suitable material and any suitable deposition process may be utilized.

Additionally, while FIG. 2A illustrates the first dielectric layer 215 as being directly on and in physical contact with the first substrate 217, this is intended to be illustrative and is not intended to be limiting. Rather, other dielectric materials and other substrate materials (e.g., silicon, germanium, gallium arsenide, combinations of these, or the like) may also be present between the first dielectric layer 215 and the first substrate 217. All such combinations of layers may be used, and all are fully intended to be included within the scope of the embodiments.

Once the first dielectric layer 215 is located over the first substrate 217, the stack 211 of carbon nanotubes 101 are transferred from the filter membrane 117 to the first dielectric layer 215. In an embodiment the transfer may be performed by initially removing the filter membrane 117 from the system 100 and then applying a transfer layer (not separately illustrated) to the stack 211 of carbon nanotubes 101. In an embodiment the transfer layer may be a material that may be used to hold and protect the stack 211 of carbon nanotubes 101 while also allowing for an easy removal of the transfer layer once the stack 211 of carbon nanotubes 101 has been transferred. For example, the transfer layer may be polycarbonate (PC), polymethyl-methacrylate (PMMA), although any other suitable material, such as methyacrylic resin or Novolac resin, or the like, may alternatively be utilized.

In an embodiment in which the transfer layer is PMMA, the transfer layer may be placed on the stack 211 of carbon nanotubes 101 using, e.g., a spin-coating process, although any other suitable deposition process may also be utilized. Once in place, the PMMA may be cured and solidified. This solidified PMMA both protects the stack 211 of carbon nanotubes 191 and also allows for the movement and control of the stack 211 of carbon nanotubes 191 through the transfer layer.

Once the transfer layer has been put into place over the stack 211 of carbon nanotubes 101, the transfer layer may be utilized to place the stack 211 of carbon nanotubes 101 over the first substrate 217 and in contact with the first dielectric layer 215. The placement of the stack 211 of carbon nanotubes 101 may be performed by controlling the transfer layer (with the stack 211 of carbon nanotubes 101 attached) and using the transfer layer to place the stack 211 of carbon nanotubes 101.

Additionally, in certain embodiments the stack 211 of carbon nanotubes 101 may have a greater alignment along one surface of the stack 211 than along another surface of the stack 211. In such embodiments, the stack 211 of carbon nanotubes 101 may be placed so that the surface with the greater alignment is facing or in physical contact with the first substrate 217. However, any suitable placement may be utilized.

Once the stack 211 of carbon nanotubes 101 has been placed on the first dielectric layer 215, the transfer layer may be removed. In an embodiment the transfer layer may be removed using a stripping or etching process to remove the material of the transfer layer from the stack 211 of carbon nanotubes 101. As such, while the materials utilized to remove the transfer layer may be at least in part dependent upon the material chosen for the transfer layer, in an embodiment in which the transfer layer is PMMA, the transfer layer may be removed by applying acetone to the PMMA, which dissolves the PMMA.

However, as one of ordinary skill in the art will recognize, the use of PMMA for the transfer layer, and the use of the transfer layer in general, is not intended to limit the embodiments. Rather, any suitable method of transferring the stack 211 of carbon nanotubes 101 and integrating the stack 211 of carbon nanotubes 101 into a manufacturing process flow may be utilized. Any other suitable method for transferring the stack 211 of carbon nanotubes 101 are fully intended to be included within the scope of the embodiments.

Once the stack 211 of carbon nanotubes 101 has been transferred, the stack 211 of carbon nanotubes 101 may have between about 30 layers of carbon nanotubes 101 and about 60 layers of carbon nanotubes. As such, the stack 211 of carbon nanotubes 101 may have a thickness of between about 50 nm and about 100 nm. However, any suitable number of carbon nanotubes 101 and any suitable thickness may be utilized.

Additionally, by using the solution based filtering method as described above, a high density, extremely pure layer of the carbon nanotubes 101 may be obtained. For example, the carbon nanotubes may have a purity of greater than about 99.99%. Additionally, within each layer of the carbon nanotubes 101, there may be a density of about 500 carbon nanotubes per micron. However, any suitable purity and any suitable density may be utilized.

Figure 3A:
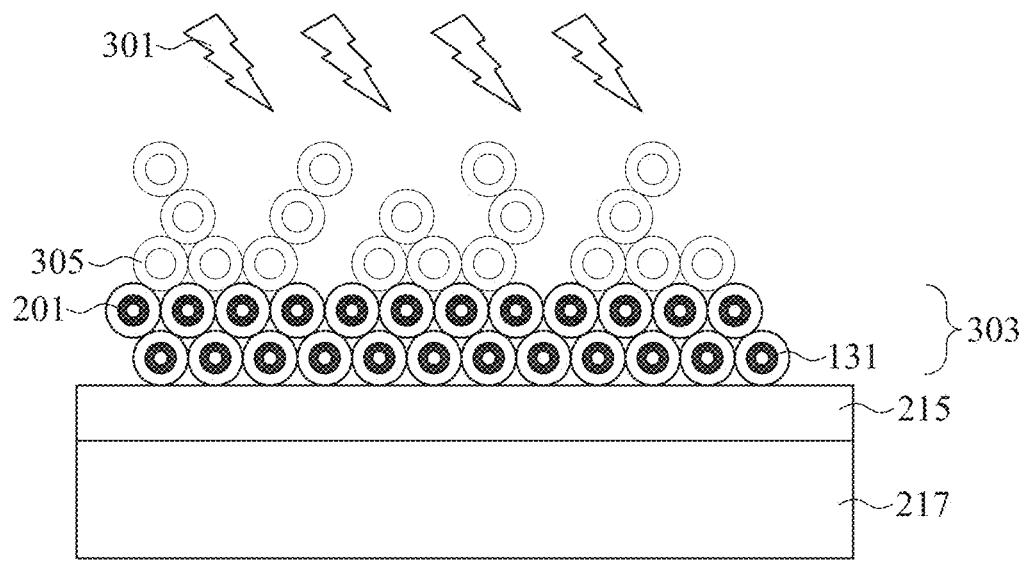
FIGS. 3A-3B illustrates a thinning of the stack of nanotubes a first time, in accordance with some embodiments.
Figure 3B:
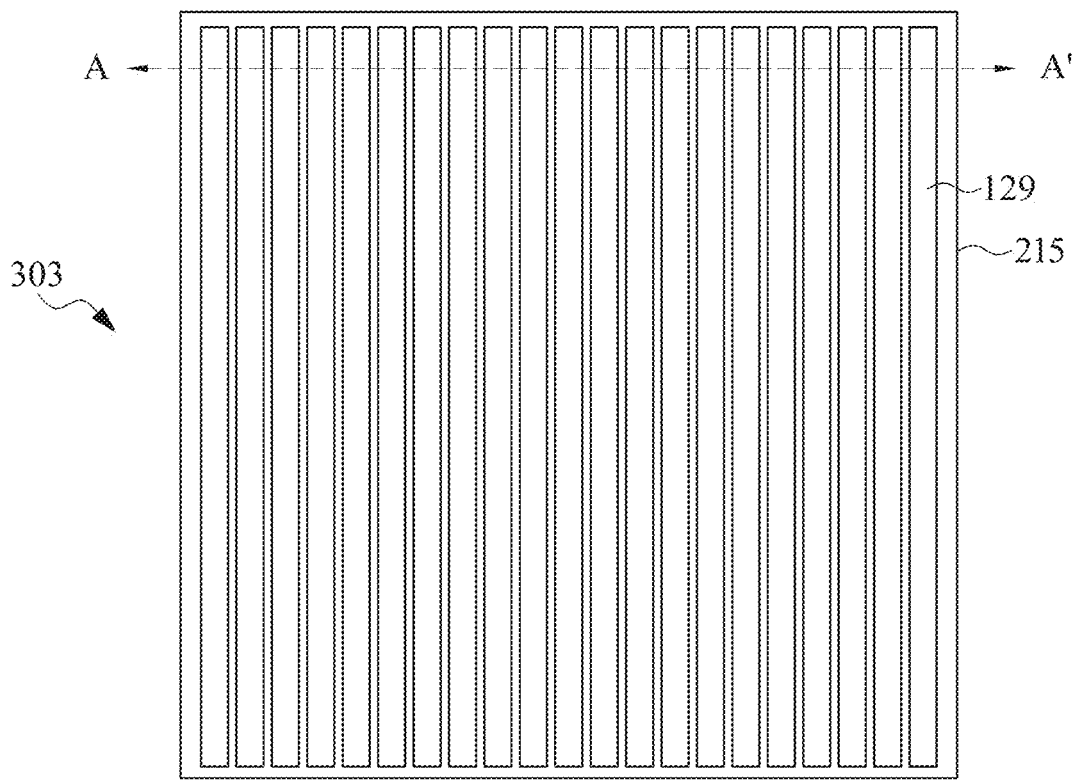

FIGS. 3A-3B illustrate that, once the stack 211 of carbon nanotubes 101 has been transferred to the first dielectric layer 215, a thickness of the stack 211 of carbon nanotubes 101 may be reduced, with FIG. 3A illustrating a cross sectional view of the top down view of FIG. 3B through line A-A'. In an embodiment the reduction may be performed using a destructive thinning process (represented in FIG. 3A by the arrows labeled 301). For example, in some embodiments the destructive thinning process 301 may be performed using a process such as reactive ion dry etching, sonication thinning, dissolution thinning, chemical intercalation thinning, mechanical grinding, chemical mechanical polishing, chemical polishing, combinations of these, or the like. However, any suitable thinning process may be utilized.

In an embodiment the stack 211 of carbon nanotubes 101 may be thinned so that only a desired number of carbon nanotubes (e.g., the first layer 131 of carbon nanotubes 101 and the second layer 201 of carbon nanotubes 101) remain within a reduced stack 303 of the carbon nanotubes 101. In an embodiment the reduced stack 303 of carbon nanotubes 101 may have between about 3 layers of carbon nanotubes 101 and about 6 layers of carbon nanotubes. As such, the reduced stack 303 of carbon nanotubes 101 may have a thickness of between about 5 nm and about 10 nm. However, any suitable number of carbon nanotubes 101 and any suitable thickness may be utilized.

However, the destructive thinning processes 301 as described above are not perfect. As such, while many of the carbon nanotubes 101 that are desired to be removed are actually removed, the use of the destructive thinning processes 301 will also damage, but may not remove, at least some of the carbon nanotubes 101 that had been present in the layers that were desired to be removed (e.g., the third layer 203 of the carbon nanotubes 101, the fourth layer 205 of the carbon nanotubes 101, the fifth layer 207 of the carbon nanotubes 101, and the sixth layer 209 of the carbon nanotubes 101), thereby forming damaged carbon nanotubes 305.

Figure 4A:
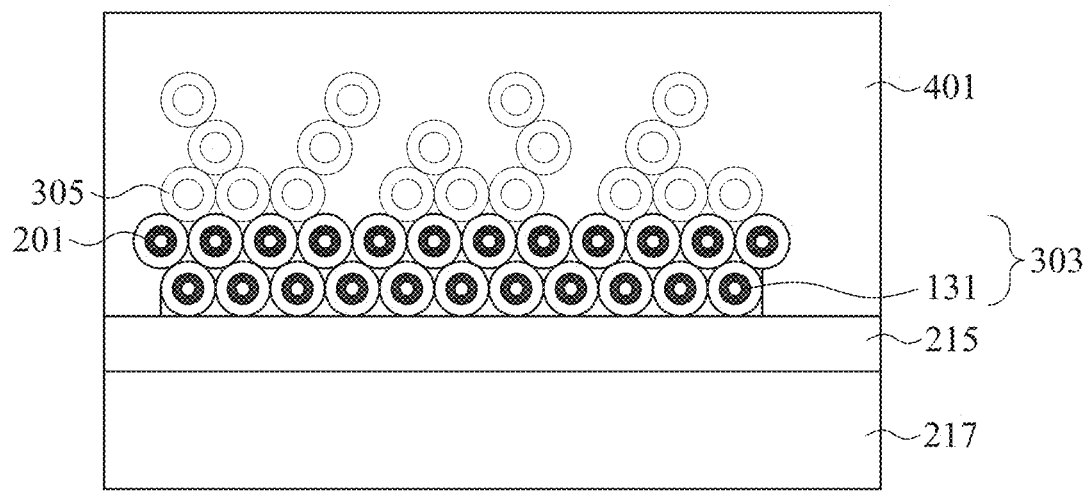
FIGS. 4A-4B illustrate a deposition of a supporting layer, in accordance with some embodiments.
Figure 4B:
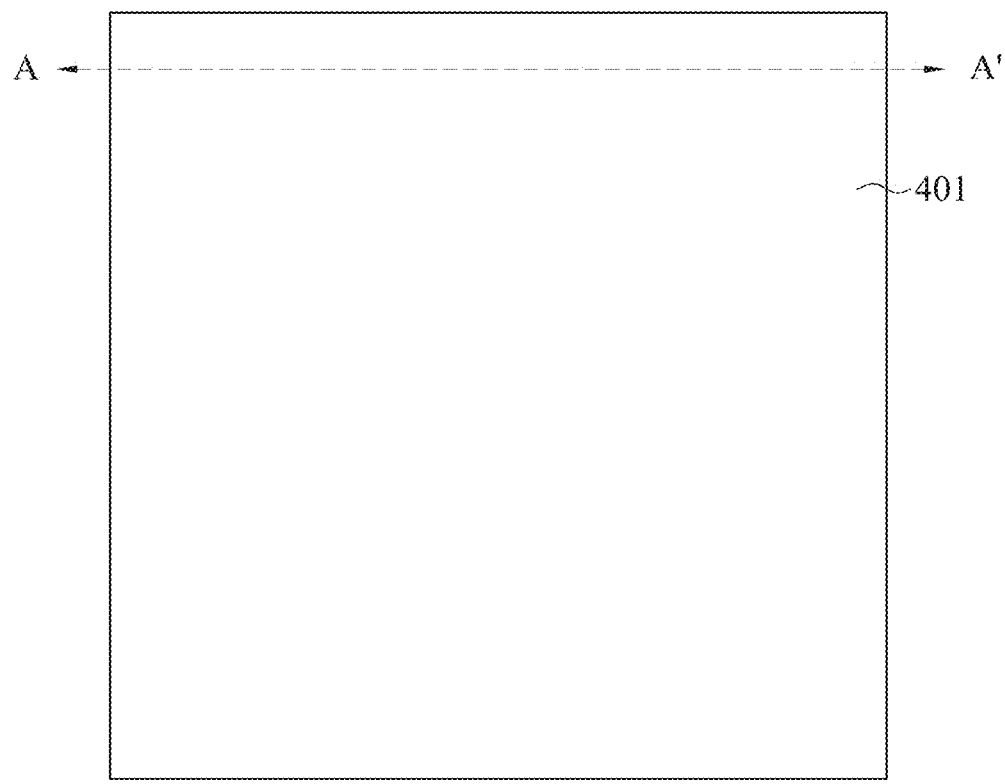

FIGS. 4A-4B illustrate that, once the stack 211 of carbon nanotubes 101 has been reduced to the reduced stack 303 of the carbon nanotubes 101, a supporting layer 401 is deposited over the reduced stack 303 of the carbon nanotubes 101, with FIG. 4A illustrating a cross sectional view of the top down view of FIG. 4B through line A-A'. In an embodiment the supporting layer 401 works as an adhesion layer for a subsequent non-destructive thinning process (not illustrated in FIGS. 4A-4B but illustrated and discussed further below with respect to FIGS. 5A-5B). As such, in some embodiments the material of the supporting layer 401 may be a metal such as nickel, molybdenum, tungsten, platinum, bismuth, combinations of these, or the like. In such an embodiment the material of the supporting layer 401 may be deposited using an evaporation deposition process, a chemical vapor deposition process, a sputtering process, an atomic layer deposition process, combinations of these, or the like. Any suitable deposition process may be utilized.

In other embodiments the supporting layer 401 may be an organic material such as polymethyl methacrylate (PMMA), polyvinyl acetate (PVA), polyvinylpyrrolidone (PVP), polypropylene carbonate (PPC), other polyaromatic hydrocarbons (PAHs), phenyltrimethoxysilane (PTMS), polydimethylsiloxane (PDMS), rosin, combinations of these, or the like. In embodiments such as this, the material of the supporting layer 401 may be deposited using a deposition method such as spin-coating or the like. However, any suitable material and method of deposition may be utilized.

Figure 5A:
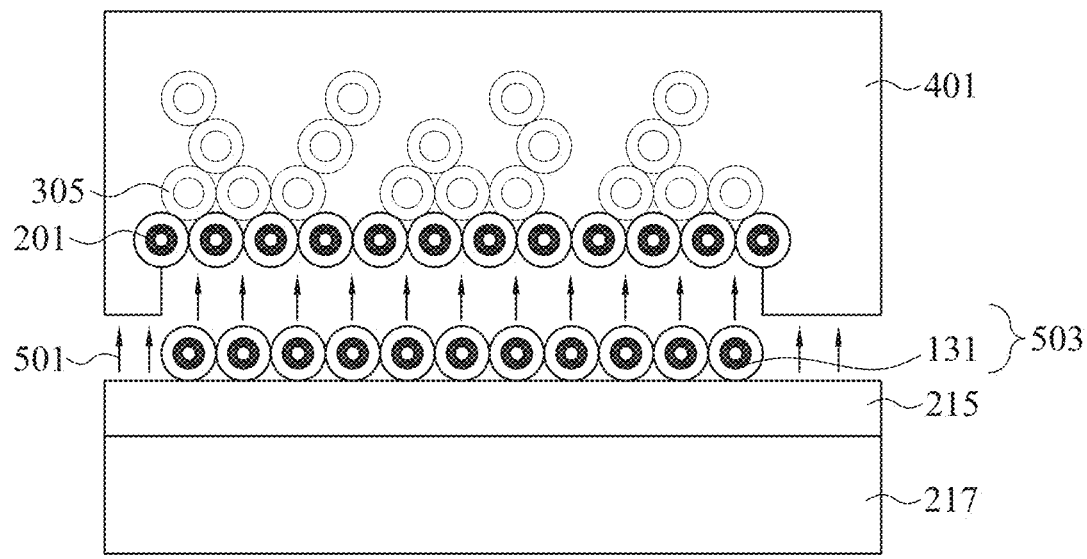
FIGS. 5A-5B illustrate a thinning of the stack of nanotubes a second time, in accordance with some embodiments.
Figure 5B:
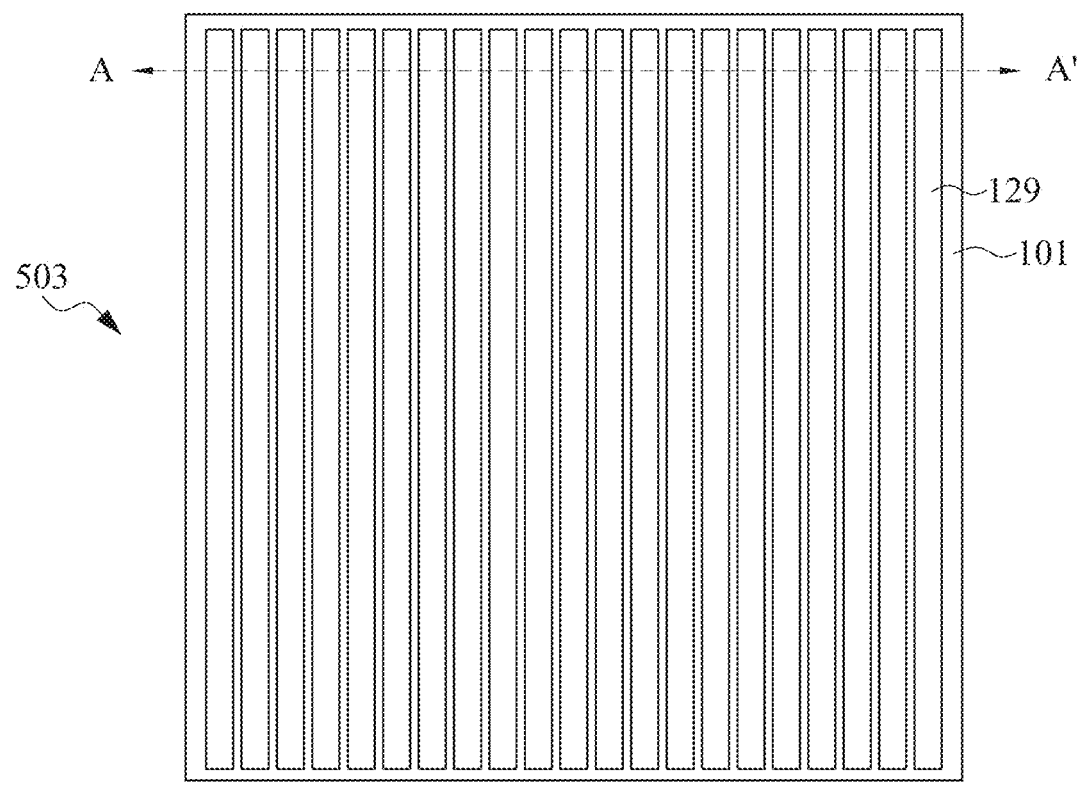

FIGS. 5A-5B illustrate that, once the supporting layer 401 has been deposited, additional ones of the carbon nanotubes 101 (e.g., the second layer 201 of carbon nanotubes) are removed from the reduced stack 303 of the carbon nanotubes 101 to form an operational layer 503, with FIG. 5A illustrating a cross sectional view of the top down view of FIG. 5B through line A-A'. In an embodiment, and to avoid damage to underlying layers, the additional ones of the carbon nanotubes 101 are removed using a non-destructive thinning process (represented in FIG. 5A by the arrows labeled 501).

In some embodiments the non-destructive thinning process 501 may be performed by removing the supporting layer 401 using a process such as mechanical exfoliation. In a particular embodiment which uses mechanical exfoliation, an adhesive material such as a Scotch-type tape may be applied to the supporting layer 401. Once applied and adhered to the supporting layer 401, a force may be applied to the adhesive material to remove the supporting layer 401.

However, in addition to simply removing the supporting layer 401 by itself, the removal of the supporting layer 401 will additionally remove the damaged carbon nanotubes 305 which are covered by the supporting layer 401 as well as one or more layers of the carbon nanotubes 101 (e.g., the second layer 201 of the carbon nanotubes 101 in FIG. 5A). As such, the non-destructive thinning process 501 can be utilized to remove the damaged carbon nanotubes 305 so that the damaged carbon nanotubes 305 cannot interfere with subsequent processes. Additionally, the non-destructive thinning process 501 can further be used to further thin the reduced stack 303 of the carbon nanotubes 101 without generating additional damaged carbon nanotubes 101.

Additionally, while the mechanical exfoliation process described above is one such process which may be utilized to remove the supporting layer 401 and reduce the thickness of the reduced stack 303, this description is intended to be illustrative and is not intended to be limiting. Rather, any suitable non-destructive thinning process, such as using a sacrificial metal layer for thinning by carbon diffusion during anneal, using a removal of the spacers 129 inserted into the structured carbon nanotube film (e.g., the stack 211) using either chemical methods or a vacuum anneal, or thinning of the reduced stack 303 by sonication or mechanical releases, may also be utilized. Any such method of non-destructive thinning may be utilized and all such methods are fully intended to be included within the scope of the embodiments.

Once the operational layer 503 of carbon nanotubes 101 has been formed, the operational layer 503 of carbon nanotubes 101 may have a single layer of carbon nanotubes 101. As such, the operational layer 503 of carbon nanotubes 101 may have a thickness of between about 1 nm and about 1.5 nm. However, any suitable number of carbon nanotubes 101 and any suitable thickness may be utilized.

In the embodiment illustrated in FIGS. 3A-5B, the destructive thinning process 301 may be performed to reduce the stack 211 of carbon nanotubes 101 to have only two of the layers of carbon nanotubes 101 while the non-destructive thinning process 501 removes only a single layer of the carbon nanotubes 101 to leave behind a single layer of the carbon nanotubes. This, however, is intended to be illustrative and is not intended to be limiting to the embodiments. Rather, any suitable combinations or repetition of steps may be utilized to obtain the operational layer 503 of the carbon nanotubes 101.

For example, in some embodiments the destructive thinning process 301 may be omitted entirely or else be performed to remove only a minimal number of layers of the carbon nanotubes 101 (e.g., remove one or two layers of the carbon nanotubes 101). In such an embodiment most or all of the thinning to obtain the operational layer 503 of the carbon nanotubes 101 is performed using the non-destructive thinning process 501. Additionally, if one such non-destructive thinning process 501 is not sufficient to thin the stack 211 of the carbon nanotubes 101, the non-destructive thinning process 501 may be repeated one or more times in order to remove successive layers of the carbon nanotubes 101 until the desired number of layers of carbon nanotubes 101 has been obtained. Any suitable number of iterations in any order may be used, and all such combinations are fully intended to be included within the scope of the embodiments.

Figure 6A:
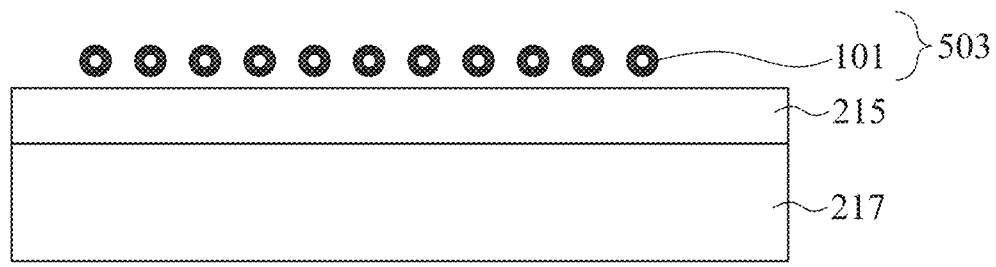
FIGS. 6A-6B illustrate a removal of spacers from around the nanotubes, in accordance with some embodiments.
Figure 6B:
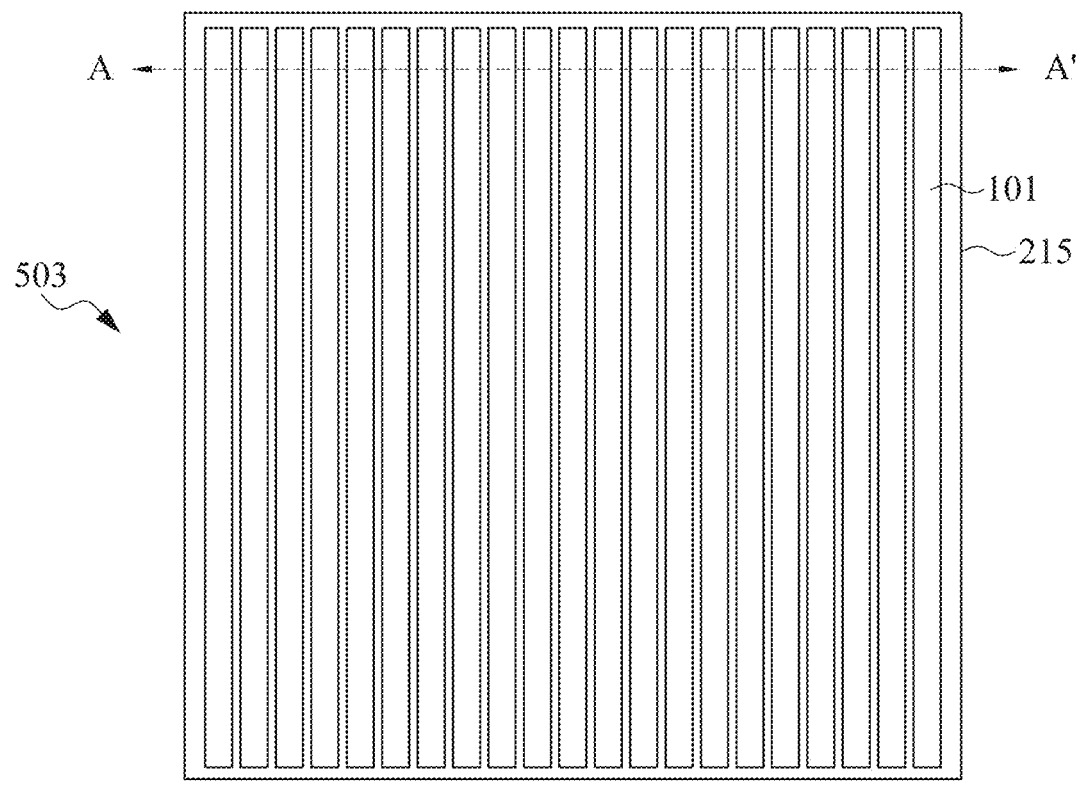

FIGS. 6A-6B illustrate that, once the operational layer 503 of the carbon nanotubes 101 has been formed, the spacers 129 may optionally be removed from around the carbon nanotubes 101, with FIG. 6A illustrating a cross sectional view of the top down view of FIG. 6B through line A-A'. In an embodiment in which the spacers 129 are a surfactant or a polymer, the spacers 129 may be removed using an annealing process, whereby a temperature of the material of the spacers 129 is increased until either the material evaporates (if possible) or else suffers a thermal decomposition, after which the material may be easily removed.

In another embodiment in which the material of the spacers 129 is a dielectric material, the spacers 129 may be removed using an etching process. In a particular embodiment the spacers 129 may be removed using a wet etching process with an etchant that is selective to the material of the spacers 129. However, any suitable etching or other removal process may be utilized.

By utilizing the spacers 129 during alignment and then removing the spacers 129, the pitch of the remaining carbon nanotubes 101 may be precisely controlled by controlling the thickness of the spacers 129. As such, in some embodiments the carbon nanotubes 101 may have a pitch of between about 0 nm and about 100 nm. However, any suitable pitch may be utilized.

Figure 7A:
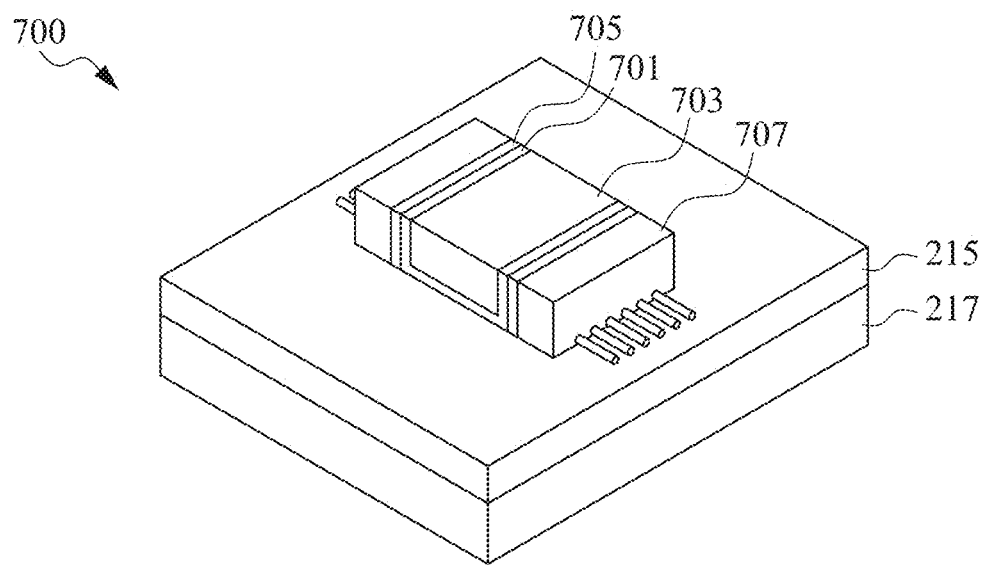
FIGS. 7A-7D illustrate a formation of a transistor, in accordance with some embodiments.
Figure 7B:
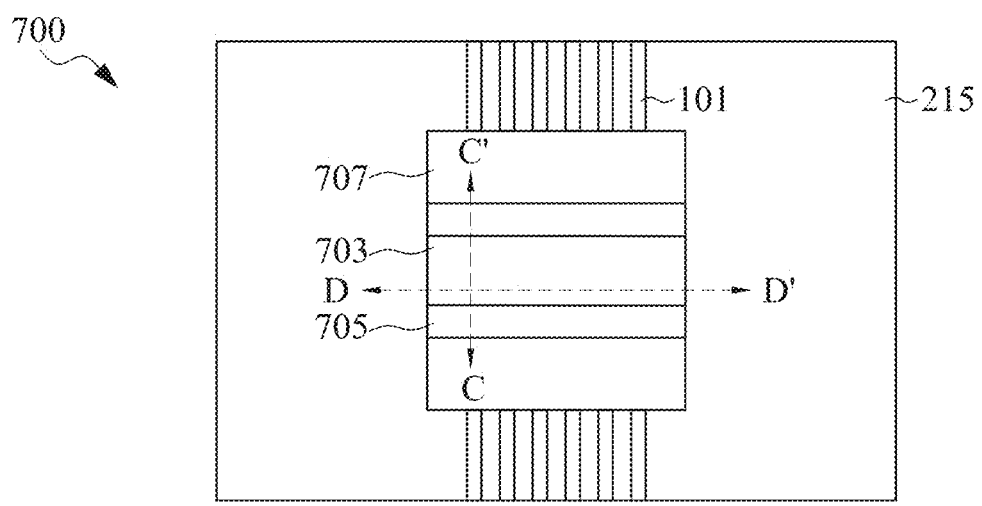
Figure 7C:
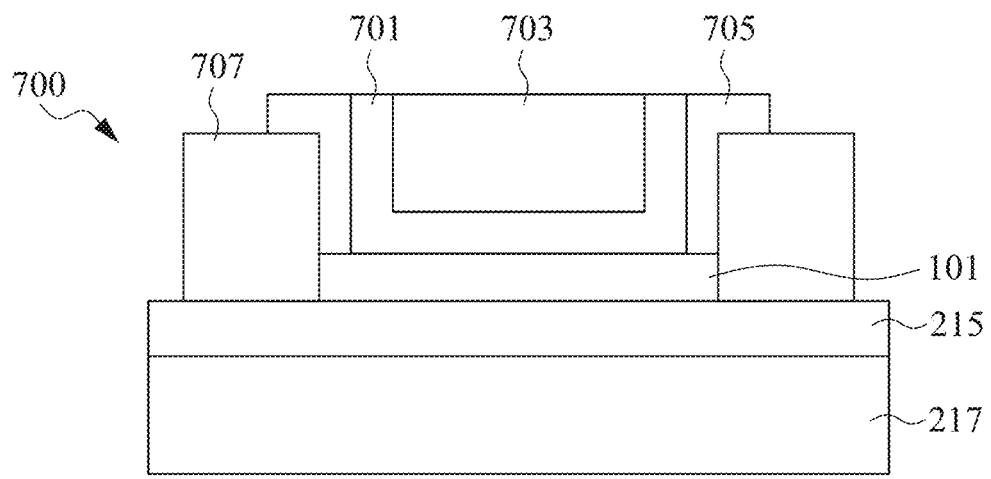
Figure 7D:
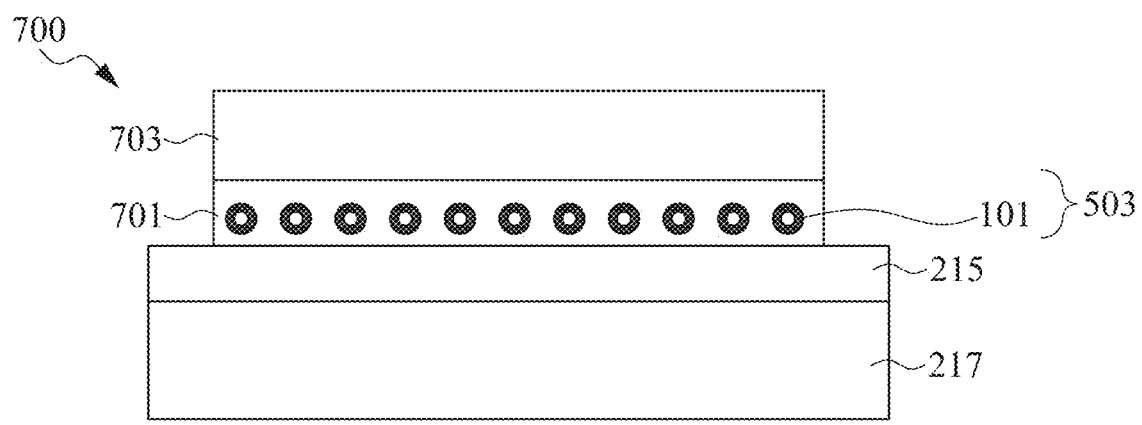

FIGS. 7A-7B illustrate an isometric view (in FIG. 7A) and a top down view (in FIG. 7B) in which the operational layer 503 of the carbon nanotubes 101 are utilized to form a planar transistor 700. In addition, FIG. 7C illustrates a first cross-sectional view of the planar transistor 700 through line C-C' and FIG. 7D illustrates a second cross-sectional view of the planar transistor 700 through line D-D'. In particular, once the operational layer 503 of the carbon nanotubes 101 has been formed, source/drain contacts 707 may be formed, gate spacers 705 may be formed, a gate dielectric 701 may be formed, and a gate electrode 703 may be formed. However, any suitable combination of structures may be utilized.

In an embodiment the source/drain contacts 707 may be formed on opposite sides of a channel region located within the carbon nanotubes 101 and in contact with the sidewalls of source/drain regions which are also located within the carbon nanotubes 101 on opposite sides of the channel region. In accordance with some embodiments, the formation of the source/drain contacts 707 includes forming and patterning an etching mask such as a photoresist (not separately illustrated in FIGS. 7A-7D) so that the regions in which the source/drain contacts 707 are to be formed are exposed, while other regions are covered by the etching mask. A conductive layer such as a metal layer (e.g., tungsten, cobalt, combinations of these, or the like) is then deposited as a blanket layer. A lift-off process is then performed, with the etching mask being lifted off, and the portions of the conductive layer on the etching mask also being removed. As such, source/drain contacts 707 are left as shown in FIGS. 7A-7D.

Once the source/drain contacts 707 have been formed, the gate spacers 705 may be formed in order to separate the source/drain contacts 707 from the gate electrode 703. In an embodiment the gate spacers 705 may be formed by conformally depositing an insulating material and subsequently anisotropically etching the insulating material. The insulating material of the gate spacers 705 may be silicon oxide, silicon nitride, silicon oxynitride, silicon carbonitride, a combination thereof, or the like. However, any suitable material and deposition process may be utilized.

Once the material for the gate spacers 705 has been formed, the gate dielectric 701 may be formed. In an embodiment the gate dielectric 701 comprises one or more dielectric layers, such as one or more layers of silicon oxide, silicon nitride, metal oxide, metal silicate, or the like. For example, in some embodiments, the gate dielectric 701 includes a high-k dielectric material, such as a metal oxide or a silicate of hafnium, aluminum, zirconium, lanthanum, manganese, barium, titanium, lead, and combinations thereof. The gate dielectric 701 may include a dielectric layer having a k value greater than about 7.0. The formation methods of the gate dielectric 701 may include depositing a gate dielectric layer (not separately illustrated in FIGS. 7A-7D) through a deposition process such as Molecular-Beam Deposition (MBD), ALD, PECVD, and the like. However, any suitable materials and methods of manufacture may be utilized to deposited the material for the gate dielectric 701.

Once the material for the gate dielectric 701 has been deposited, the material for the gate electrode 703 is deposited. The material for the gate electrode 703 may be formed by initially forming a gate electrode layer (not separately illustrated in FIGS. 7A-7D). In an embodiment the gate electrode layer comprises a conductive material and may be selected from a group comprising of polycrystalline-silicon (poly-Si), polycrystalline silicon-germanium (poly-SiGe), metallic nitrides, metallic silicides, metallic oxides, and metals. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metals include tantalum, tungsten, titanium, aluminum, copper, molybdenum, nickel, platinum, etc.

In an embodiment the gate electrode layer may be deposited by chemical vapor deposition (CVD), sputter deposition, or other techniques known and used in the art for depositing conductive materials. The thickness of the gate electrode layer may be in the range of about 200 angstroms to about 4,000 angstroms. The top surface of the gate electrode layer usually has a non-planar top surface, and may be planarized prior to patterning of the gate electrode layer or gate etch. Dopants may or may not be introduced into the gate electrode layer at this point. Dopants may be introduced, for example, by molecular doping techniques thru charge transfer.

Once the gate electrode layer has been formed, the gate electrode layer, the gate dielectric layer, and the gate spacers 705 may be planarized. In an embodiment the material of the gate electrode layer and the material of the gate dielectric layer are planarized to form the gate electrode 703 and the gate dielectric 701 using, e.g., a chemical mechanical polishing process. However, any suitable method of planarization may be utilized.

Once planarized, if desired, the source/drain contacts 707 may be exposed from any remaining overlying material (e.g., the material of the gate spacers 705). In some embodiments the source/drain contacts 707 may be exposed using, for example, a photolithographic masking and etching process, whereby a photoresist is deposited and patterned in order to overly and protect portions of the gate spacers 705, the gate dielectric 701, and the gate electrode 703, while exposing other portions. Once protected, an etching process, such as a reactive ion etching process, may be utilized in order to expose portions of the source/drain contacts 707. However, any suitable process may be utilized to expose the source/drain contacts 707 for further processing, such as formation of an overlying metallization layer.

By utilizing the non-destructive thinning process 501 to perform the final thinning steps and obtain the operational layer 503, any damaged carbon nanotubes 101 may be removed from the structure and will not be present to potentially interfere with subsequent manufacturing processes. Additionally, such a process allows for a greater degree of control over the thinning process, allowing for very precise determination of how many layers of carbon nanotubes 101 can be used. All of these benefits help to increase yield and make the process more efficient by preventing defects that may otherwise occur and forms devices with improved performance to achieve targets beyond the 2 nm node.

In an embodiment, a method of manufacturing a semiconductor device, the method includes: forming a stack of nanotubes, wherein individual nanotubes are aligned with adjacent nanotubes; depositing a supporting layer over the stack of nanotubes; removing the supporting layer, wherein the removing the supporting layer further removes at least one layer of nanotubes from the stack of nanotubes; and depositing a gate electrode over a remaining portion of the stack of nanotubes. In an embodiment the method further includes, after the removing the supporting layer, removing a spacer material from around at least one nanotube within the remaining portion of the stack of nanotubes. In an embodiment the forming the stack of nanotubes comprises filtering the individual nanotubes through a filter membrane. In an embodiment the filter membrane has a first electrostatic field during the filtering the individual nanotubes. In an embodiment the individual nanotubes are surrounded by a spacer material during the filtering the individual nanotubes, the spacer material having a second electrostatic field. In an embodiment the stack of nanotubes has a nanotube density of about 500 nanotubes per micrometer. In an embodiment the spacer material comprises a surfactant.

In another embodiment, a method of manufacturing a semiconductor device includes: filtering a carbon nanotube solution through a filter membrane, the filter membrane having a electrostatic field, wherein during the filtering a first layer of carbon nanotubes, a second layer of carbon nanotubes, and a third layer of carbon nanotubes are deposited on the filter membrane; transferring the first layer of carbon nanotubes, the second layer of carbon nanotubes, and the third layer of carbon nanotubes to a dielectric layer over a substrate; removing the third layer of carbon nanotubes with a destructive removal process; removing the second layer of carbon nanotubes with a non-destructive removal process; and forming a gate electrode over the first layer of carbon nanotubes after the removing the second layer of carbon nanotubes. In an embodiment the destructive removal process comprises a reactive ion etching process. In an embodiment the non-destructive removal process comprises a mechanical exfoliation process. In an embodiment the mechanical exfoliation process further comprising depositing a supporting layer over the second layer of carbon nanotubes, and wherein the mechanical exfoliation process removes both the supporting layer and the second layer of carbon nanotubes. In an embodiment the mechanical exfoliation process further removes carbon nanotubes damaged during the destructive removal process. In an embodiment the method further includes removing a spacer material from carbon nanotubes within the first layer of carbon nanotubes. In an embodiment the first layer of carbon nanotubes has a density of about 500 nanotubes per micrometers.

In yet another embodiment, a method of manufacturing a semiconductor device includes: receiving a solution, the solution comprising carbon nanotubes; aligning the carbon nanotubes using a first electrostatic field into a stack of aligned carbon nanotubes; placing the stack of aligned carbon nanotubes onto a dielectric material; thinning the stack of aligned carbon nanotubes a first time with a first process; thinning the stack of aligned carbon nanotubes a second time with a second process different from the first process; and depositing a source/drain contact in electrical connection with the stack of aligned carbon nanotubes after the thinning the stack of aligned carbon nanotubes the second time. In an embodiment after the thinning the stack of aligned carbon nanotubes the second time a thickness of the stack of aligned carbon nanotubes is less than 2 nm. In an embodiment the first process is an etching process. In an embodiment the second process is an exfoliation process. In an embodiment the first electrostatic field is generated by a material located on a filter membrane. In an embodiment the carbon nanotubes are surrounded by a spacer material during the aligning the carbon nanotubes, the spacer material generating a second electrostatic field.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a stack of nanotubes, wherein individual nanotubes are aligned with adjacent nanotubes;
   depositing a supporting layer over the stack of nanotubes;
   removing the supporting layer, wherein the removing the supporting layer further removes at least one layer of nanotubes from the stack of nanotubes; and
   depositing a gate electrode over a remaining portion of the stack of nanotubes.

2. The method of claim 1, wherein the forming the stack of nanotubes comprises filtering the individual nanotubes through a filter membrane.

3. The method of claim 2, wherein the filter membrane has a first electrostatic field during the filtering the individual nanotubes.

4. The method of claim 3, wherein the individual nanotubes are surrounded by a spacer material during the filtering the individual nanotubes, the spacer material having a second electrostatic field.

5. The method of claim 4, wherein the stack of nanotubes has a nanotube density of about 500 nanotubes per micrometer.

6. The method of claim 4, wherein the spacer material comprises a surfactant.

7. The method of claim 1, further comprising, after the removing the supporting layer, removing a spacer material from around at least one nanotube within the remaining portion of the stack of nanotubes.

8. A method of manufacturing a semiconductor device, the method comprising:
   filtering a carbon nanotube solution through a filter membrane, the filter membrane having a electrostatic field, wherein during the filtering a first layer of carbon nanotubes, a second layer of carbon nanotubes, and a third layer of carbon nanotubes are deposited on the filter membrane;
   transferring the first layer of carbon nanotubes, the second layer of carbon nanotubes, and the third layer of carbon nanotubes to a dielectric layer over a substrate;
   removing the third layer of carbon nanotubes with a destructive removal process;
   removing the second layer of carbon nanotubes with a non-destructive removal process; and
   forming a gate electrode over the first layer of carbon nanotubes after the removing the second layer of carbon nanotubes.

9. The method of claim 8, wherein the destructive removal process comprises a reactive ion etching process.

10. The method of claim 9, wherein the non-destructive removal process comprises a mechanical exfoliation process.

11. The method of claim 10, wherein the mechanical exfoliation process further comprising depositing a supporting layer over the second layer of carbon nanotubes, and wherein the mechanical exfoliation process removes both the supporting layer and the second layer of carbon nanotubes.

12. The method of claim 11, wherein the mechanical exfoliation process further removes carbon nanotubes damaged during the destructive removal process.

13. The method of claim 8, further comprising removing a spacer material from carbon nanotubes within the first layer of carbon nanotubes.

14. The method of claim 13, wherein the first layer of carbon nanotubes has a density of about 500 nanotubes per micrometers.

15. A method of manufacturing a semiconductor device, the method comprising:
receiving a solution, the solution comprising carbon nanotubes;
aligning the carbon nanotubes using a first electrostatic field into a stack of aligned carbon nanotubes;
placing the stack of aligned carbon nanotubes onto a dielectric material;
thinning the stack of aligned carbon nanotubes a first time with a first process;
thinning the stack of aligned carbon nanotubes a second time with a second process different from the first process; and
depositing a source/drain contact in electrical connection with the stack of aligned carbon nanotubes after the thinning the stack of aligned carbon nanotubes the second time.

16. The method of claim 15, wherein the first process is an etching process.

17. The method of claim 16, wherein the second process is an exfoliation process.

18. The method of claim 15, wherein the first electrostatic field is generated by a material located on a filter membrane.

19. The method of claim 18, wherein the carbon nanotubes are surrounded by a spacer material during the aligning the carbon nanotubes, the spacer material generating a second electrostatic field.

20. The method of claim 15, wherein after the thinning the stack of aligned carbon nanotubes the second time a thickness of the stack of aligned carbon nanotubes is less than 2 nm.

* * * * *